(12) United States Patent
Chen et al.

(10) Patent No.: US 9,373,534 B2
(45) Date of Patent: Jun. 21, 2016

(54) ROTARY POSITIONING APPARATUS WITH DOME CARRIER, AUTOMATIC PICK-AND-PLACE SYSTEM, AND OPERATING METHOD THEREOF

(71) Applicant: Industrial Technology Research Institute, Hsinchu (TW)

(72) Inventors: Kuan-Chou Chen, Hsinchu (TW); Pei-Shan Wu, New Taipei (TW); Sheng-Lang Lee, Hsinchu County (TW); Chia-Ming Chen, Changhua County (TW); Fu-Ching Tung, Hsinchu (TW); Jyh-Jone Lee, Taipei (TW); Wan-Sung Lin, Tainan (TW); Kuan-Han Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 378 days.

(21) Appl. No.: 14/083,451

(22) Filed: Nov. 19, 2013

(65) Prior Publication Data
US 2014/0068923 A1     Mar. 13, 2014

Related U.S. Application Data

(63) Continuation-in-part of application No. 13/711,631, filed on Dec. 12, 2012, now Pat. No. 9,082,801.

(30) Foreign Application Priority Data

Sep. 5, 2012   (TW) .............................. 101132323 A
Aug. 19, 2013  (TW) .............................. 102129675 A

(51) Int. Cl.
*H01L 21/68*    (2006.01)
*H01L 21/683*   (2006.01)
*H01L 21/687*   (2006.01)

(52) U.S. Cl.
CPC .......... *H01L 21/68* (2013.01); *H01L 21/68728* (2013.01); *H01L 21/68764* (2013.01); *H01L 21/68771* (2013.01); *Y10T 29/49998* (2015.01)

(58) Field of Classification Search
CPC ..... C23C 14/808; H01L 21/287; H01L 21/68; H01L 21/682; H01L 21/683; H01L 21/68771; H01L 21/68764

See application file for complete search history.

(56) References Cited

U.S. PATENT DOCUMENTS 3,643,625 A  2/1972  Mahl
4,378,189 A  3/1983  Takeshita et al.
(Continued)

FOREIGN PATENT DOCUMENTS

CN  101525739   9/2009
CN  101861408   10/2010
(Continued)

OTHER PUBLICATIONS

"Office Action of Taiwan Counterpart Application", issued on Feb. 25, 2015, p. 1-p. 9.
(Continued)

*Primary Examiner* — Alexander P Taousakis
(74) *Attorney, Agent, or Firm* — Jianq Chyun IP Office

(57) ABSTRACT

A rotary positioning apparatus includes a fixing base, a rotation mechanism, two driving modules and a carrier. The rotation mechanism is disposed on the fixing base, the first driving module is disposed on the fixing base and coupled to the rotation mechanism to drive the rotation mechanism rotating around a first rotation axis relatively to the fixing base. The carrier has plural accommodating slots on a circular-arc surface thereof and is pivoted to the rotation mechanism through a second rotation axis passing through the curvature center of the circular-arc surface and perpendicular to the first rotation axis, on which the curvature center is located. The second driving module is disposed on the rotation mechanism and coupled to the carrier to drive the carrier rotating around the second rotation axis relatively to the rotation mechanism. An automatic pick-and-place system and an operation method using the rotary positioning apparatus are also provided.

26 Claims, 10 Drawing Sheets

(56) References Cited

U.S. PATENT DOCUMENTS

| | | | |
|---|---|---|---|
| 4,449,478 | A | 5/1984 | Kraus |
| 4,817,559 | A | 4/1989 | Ciparisso |
| 5,138,974 | A | 8/1992 | Ciparisso |
| 5,188,501 | A | 2/1993 | Tomita et al. |
| 5,520,501 | A | 5/1996 | Kouno et al. |
| 5,762,391 | A | 6/1998 | Sumnitsch |
| 5,885,054 | A | 3/1999 | Kato et al. |
| 5,931,518 | A | 8/1999 | Pirker |
| 6,582,175 | B2 | 6/2003 | Cox et al. |
| 7,033,445 | B2 | 4/2006 | Keeton et al. |
| 7,167,805 | B2 | 1/2007 | Saeki et al. |
| 7,541,061 | B2 | 6/2009 | Ramsay |
| 8,022,448 | B1 | 9/2011 | Luu et al. |
| 8,030,725 | B1 | 10/2011 | Luu et al. |
| 8,086,348 | B2 | 12/2011 | Alberti et al. |
| 2002/0002422 | A1 | 1/2002 | Kondo et al. |
| 2002/0051704 | A1 | 5/2002 | Sundar et al. |
| 2006/0130760 | A1 | 6/2006 | Zultzke et al. |
| 2008/0216741 | A1 | 9/2008 | Ling et al. |
| 2009/0194024 | A1 | 8/2009 | Burrows et al. |
| 2010/0272893 | A1 | 10/2010 | Chang et al. |
| 2011/0049779 | A1 | 3/2011 | Egami et al. |
| 2011/0247558 | A1 | 10/2011 | Pei |
| 2012/0107072 | A1 | 5/2012 | Watanabe |

FOREIGN PATENT DOCUMENTS

| | | |
|---|---|---|
| JP | 61-220352 | 9/1986 |
| JP | 62295839 | 12/1987 |
| JP | 62295840 | 12/1987 |
| JP | 03-177215 | 8/1991 |
| JP | 04-006849 | 1/1992 |
| JP | 05-129405 | 5/1993 |
| JP | 2009141027 | 6/2009 |
| TW | 429506 | 4/2001 |
| TW | 523164 | 3/2003 |
| TW | 525628 | 3/2003 |
| TW | 547486 | 8/2003 |
| TW | I228548 | 3/2005 |
| TW | 200625434 | 7/2006 |
| TW | M362507 | 8/2009 |
| TW | 201029101 | 8/2010 |
| TW | I338785 | 3/2011 |

OTHER PUBLICATIONS

"Office Action of China Counterpart Application", issued on May 21, 2015, p. 1-p. 5.

"Notice of Allowance of U.S. Counterpart Application", issued on Mar. 12, 2015, p. 1-p. 15.

ROTARY POSITIONING APPARATUS WITH DOME CARRIER, AUTOMATIC PICK-AND-PLACE SYSTEM, AND OPERATING METHOD THEREOF

CROSS-REFERENCE TO RELATED APPLICATION

This application is a continuation-in-part application of and claims the priority benefit of U.S. application Ser. No. 13/711,631, filed on Dec. 12, 2012, now pending, which claims the priority benefit of Taiwan application serial no. 101132323, filed on Sep. 5, 2012. This continuation-in-part application also claims the priority benefit of Taiwan application no. 102129675, filed on Aug. 19, 2013. The entirety of each of the above-mentioned patent applications is hereby incorporated by reference herein and made a part of this specification.

BACKGROUND OF THE DISCLOSURE

1. Technical Field

The technical field relates to a rotary positioning apparatus with a dome carrier, an automatic pick-and-place system and an operating method thereof.

2. Background

Along with the increasing integrity of semiconductor devices in an integrated circuit (IC) day by day, the process accuracy and the production efficiency are considered relatively vital. A slight error in the semiconductor process may lead to the process failure and damage the devices (such as semiconductor or light emitting diode wafer) and therefore waste huge cost.

Taking a thermal evaporation process as an example, the process uses resistors or an electron beam to heat a film-coating material (for example, copper metal) in a crucible to be evaporated so as to reach thin film deposition goal. The method makes a compound evaporated to attach onto the surface of the wafer or a sample's surface through heating.

In consideration of film-coating cost, the most of carriers used by an evaporation equipment is circular-arc type. Currently in the relevant industry however, to pick and place a wafer depends on labour, which requires paying additional training cost. Along with the trend of bigger wafer size (for example, the size of a light emitting diode wafer has increased to 4'-6" even more) and thinning wafer, the above-mentioned manual pick-and-place way not only costs time, but has risk of damaging the wafer. As an alteration, a mechanical arm can be used to automatically pick and place a wafer, but such a mechanical arm must have multiple freedoms and flexible moving capability so as to reach arc-surface positioning requirement, which increases the design difficulty of the mechanical arm and the configuration cost.

SUMMARY

Accordingly, the disclosure is directed to a rotary positioning apparatus, which includes a fixing base, a rotation mechanism, a first driving module, a carrier and a second driving module. The rotation mechanism is disposed on the fixing base, and the first driving module is disposed on the fixing base and coupled to the rotation mechanism to drive the rotation mechanism rotating around a first rotation axis relatively to the fixing base. The carrier has a plurality of accommodating slots located on a circular-arc surface of the carrier, and the carrier is pivoted to the rotation mechanism along a second rotation axis. The second rotation axis passes through the curvature center of the circular-arc surface and is perpendicular to the first rotation axis, and the curvature center is located on the first rotation axis. The second driving module is disposed on the rotation mechanism and coupled to the carrier to drive the carrier rotating around the second rotation axis relatively to the rotation mechanism.

The disclosure provides an automatic pick-and-place system, which includes the above-mentioned rotary positioning apparatus, a pick-and-place apparatus, a plurality of positioning assemblies and an actuating element. The rotary positioning apparatus is configured to sequentially grip or place the components in the accommodating slots when each of the accommodating slots sequentially moves to a same position. Each of the positioning assemblies is disposed beside the corresponding accommodating slot for gripping and placing the components in the accommodating slots. The actuating element is disposed on the fixing base for releasing the gripping of the positioning assemblies on the components when each of the accommodating slots moves to the same position.

Based on the above-mentioned rotary positioning apparatus, the disclosure can realize the following operating method, which includes: driving the rotation mechanism rotating around a first rotation axis relatively to the fixing base by using the first driving module, and driving the carrier to rotate around the second rotation axis relatively to the rotation mechanism by using the second driving module so that the accommodating slots on the carrier sequentially move to a same position.

Based on the above-mentioned rotary positioning apparatus, the disclosure can realize the following operating method, which includes: (1) driving the carrier to rotate around the second rotation axis relatively to the rotation mechanism by using the second driving module by a first rotation angle corresponding to the angular spacing between two accommodating slots on a same circular locus; (2) repeating step (1) to make all the accommodating slots on the carrier sequentially move to the same position; (3) driving the rotation mechanism to rotate around the first rotation axis relatively to the fixing base by using the first driving module by a second rotation angle, wherein the second rotation angle is corresponding to the angular spacing between two circular loci so that one of the accommodating slots on another circular locus moves to the same position; and (4) repeating steps (1)-(2).

According to the depiction above, the rotary positioning apparatus of the disclosure drives the carrier to move through the rotations around two axes so that any one of the accommodating slots on the carrier at a specific time-point keeps a fixing position relationship with the work table surface. In addition, when the rotary positioning apparatus is used in an automatic pick-and-place system, it enables the accommodating slots of the carrier moving to a same position to achieve the arc-surface positioning need. Thus, the pick-and-place apparatus of the automatic pick-and-place system can drive the gripper jaw moving to the same position by adopting motions in two directions only without a design of complicate motions. Moreover, each of the positioning assemblies can fix the component in the corresponding accommodating slot to avoid the component from deflection during rotating the carrier. The actuating element is configured to release the gripping of the positioning assembly on the component when each of the accommodating slots moves to the same position to make the operation process of the automatic pick-and-place system more convenient.

Several exemplary embodiments accompanied with figures are described in detail below to further describe the disclosure in details.

DETAILED DESCRIPTION OF DISCLOSED EMBODIMENTS

The rotary positioning apparatus and the operating method thereof provided by the disclosure are suitable to various semiconductor processes or light emitting diode (LED) processes requiring arc-surface positioning, for example, the evaporation coating of the semiconductor wafer or LED wafer so as to move the wafers on the carrier to the same pick-and-place position to reach the arc-surface positioning effect.

Figure 1:
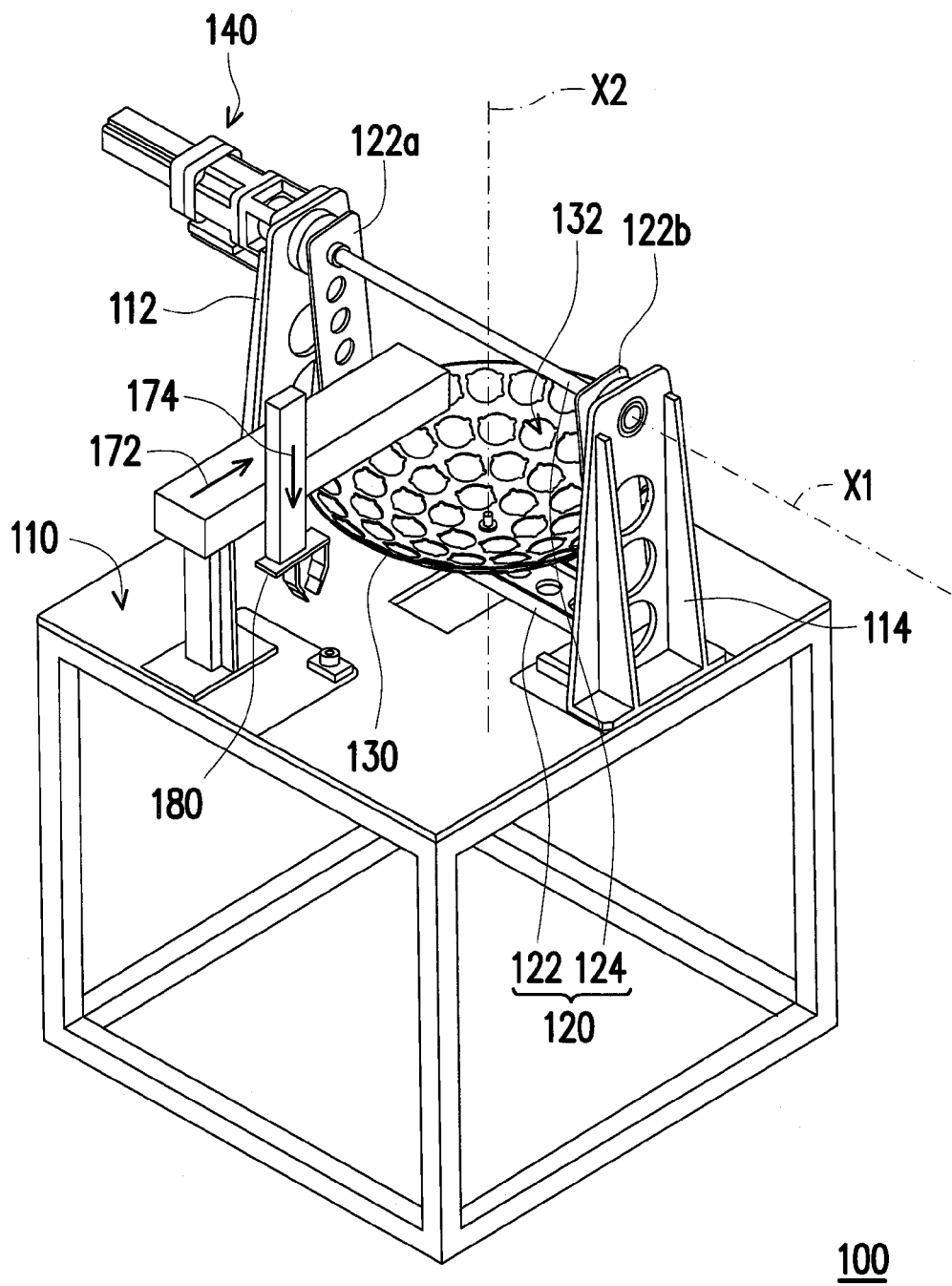
FIG. 1 is a schematic diagram of a rotary positioning apparatus according to an embodiment of the disclosure.
Figure 2:
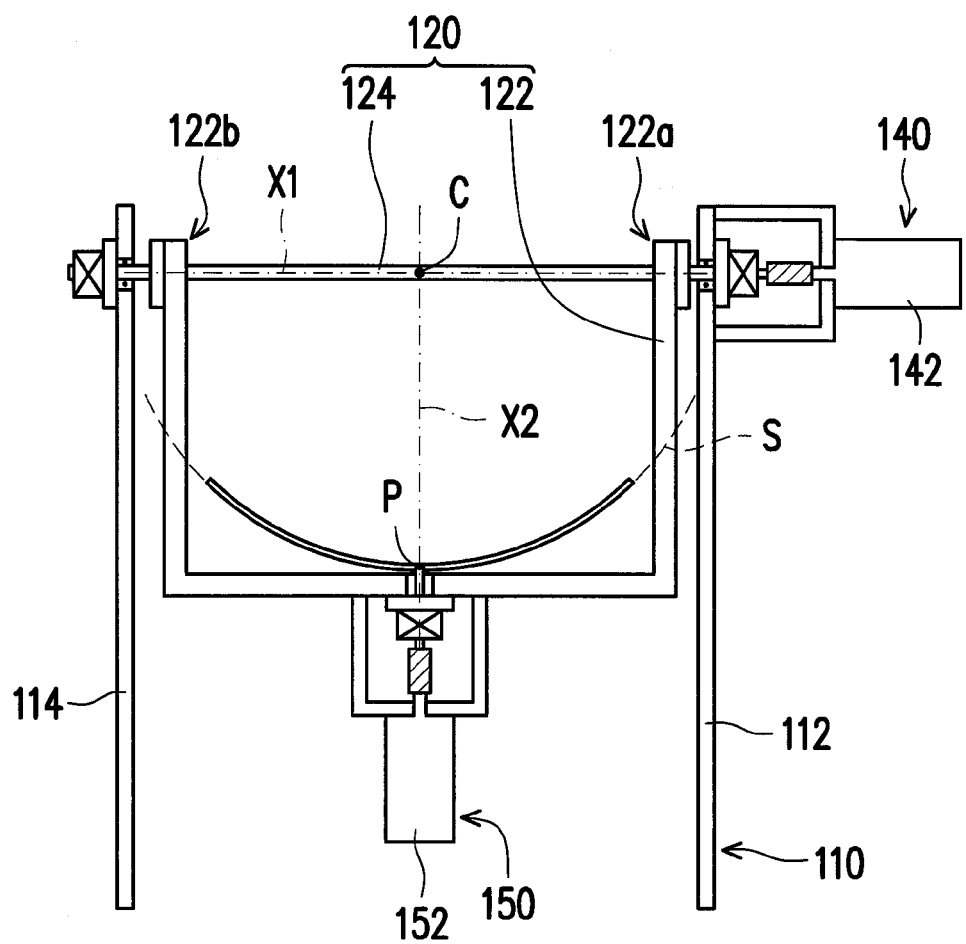
FIG. 2 is a cross-sectional diagram of the rotary positioning apparatus in FIG. 1.

FIG. 1 is a schematic diagram of a rotary positioning apparatus according to an embodiment of the disclosure and FIG. 2 is a cross-sectional diagram of the rotary positioning apparatus in FIG. 1. Referring to FIGS. 1 and 2, a rotary positioning apparatus 100 includes a fixing base 110, a rotation mechanism 120, a carrier 130, a first driving module 140 and a second driving module 150. The fixing base 110 is, for example, a base of process equipment or a transmission equipment rack and other components providing firmly support. The rotation mechanism 120 is disposed on the fixing base 110. The first driving module 140 is disposed on the fixing base 110 and coupled to the rotation mechanism 120 to drive the rotation mechanism 120 rotating around a first rotation axis X1 relatively to the fixing base 110.

In more details, the rotation mechanism 120 of the embodiment includes a swivel bracket 122 and a shaft 124. The swivel bracket 122 bears the carrier 130 and the second driving module 150 and the swivel bracket 122 is pivoted onto the fixing base 110 through the shaft 124, in which the shaft 124 coincides with the first rotation axis X1. The fixing base 110 of the embodiment includes two fixtures 112 and 114 parallel to each other, which respectively stand at opposite two sides of the swivel bracket 122. Two ends 122a and 122b of the swivel bracket 122 are coupled onto the fixtures 112 and 114 through the shaft 124 so as to advance the rotational rigidity and the positioning accuracy of the swivel bracket 122 through the shaft 124. The swivel bracket 122 is, for example, U-shaped or arc-shaped as shown by FIG. 2 or has other possible shapes. The first driving module 140, for example, includes a servo motor 142, while an end of the shaft 124 is coupled to the servo motor 142 to drive the shaft 124 for rotating through the servo motor 142 and further to drive the swivel bracket 122 rotating around the first rotation axis X1.

The carrier 130 in the embodiment is pivoted to the swivel bracket 122 through the second rotation axis X2 and the virtual pivoting point is located above the swivel bracket 122, while the second driving module 150 is disposed below the swivel bracket 122 and coupled to the carrier 130. The second driving module 150 can include a servo motor 152, by which the carrier 130 is driven to rotate around the second rotation axis X2 relatively to the swivel bracket 122.

As shown by FIG. 1, a pick-and-place part 180 is disposed at a side of the carrier 130 for conducting biaxial linear motions in directions 172 and 174 so as to grip the component on the carrier 130 or place the component on the carrier 130. The pick-and-place part 180 can be a gripper jaw, an adsorbing chuck or other similar members.

Figure 3:
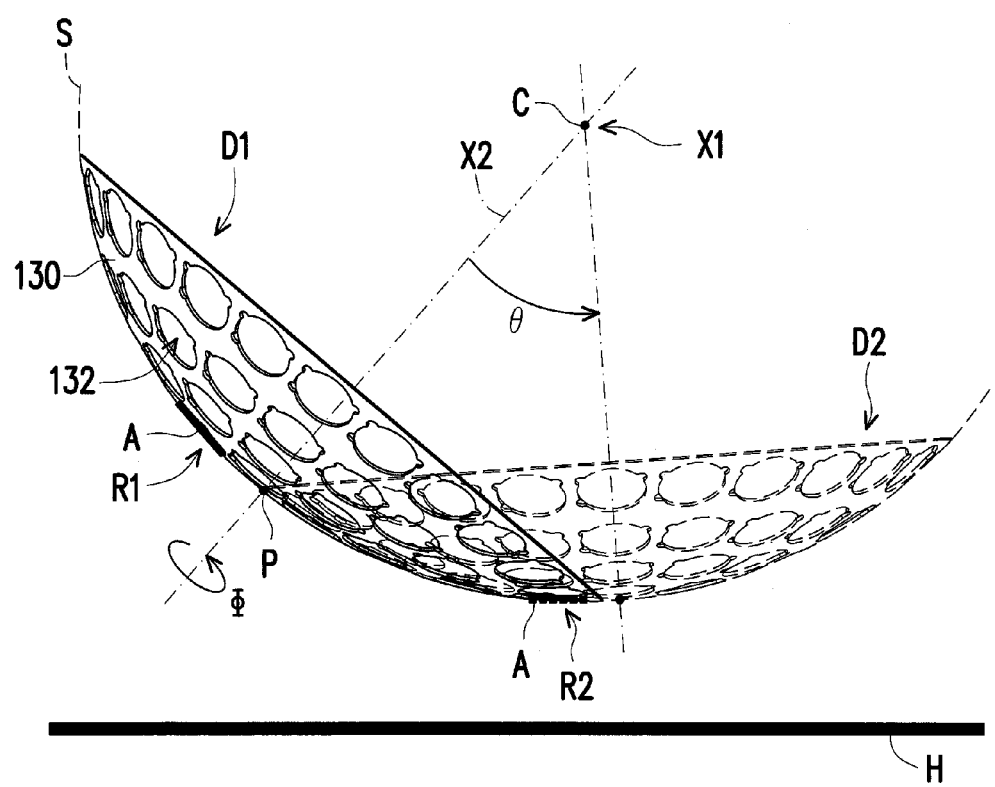
FIG. 3 is a schematic diagram illustrating the action of the carrier in FIG. 1.

FIG. 3 is a schematic diagram illustrating the action of the carrier in FIG. 1. As shown by FIGS. 1-3, the carrier 130 has a plurality of accommodating slots 132 and the carrier 130 is, for example, a dome carrier to make the accommodating slots 132 located on a circular-arc surface S, i.e., the center points of the accommodating slots 132 are located on the circular-arc surface S. In other embodiments however, the carrier 130 itself may not be circular-arc shaped, for example, it is a square carrier only providing a circular-arc bearing surface at a localized area, or other types of carriers enabling the accommodating slots distributed along the circular-arc surface.

In the embodiment, taking a wafer carrier as an example, when the wafers are placed in the accommodating slots 132, the wafer is parallel to a plane, wherein the plane passes through the center point of the accommodating slot 132 and is common tangent with the circular-arc surface S. The second rotation axis X2 passes through the curvature center C of the circular-arc surface S and is perpendicular to the first rotation axis X1, which is perpendicular to the page. In addition, the curvature center C is on the first rotation axis X1.

Under the above-mentioned layout, the embodiment uses the first driving module 140 to drive the swivel bracket 122 to make revolution around the first rotation axis X1 and uses the second driving module 150 to drive the carrier 130 to make rotation around the second rotation axis X2 so as to establish a rotary positioning mode under a spherical coordinate system. Specifically, by taking the curvature center C of the circular-arc surface S as the origin of the spherical coordinate system (r, θ, Φ), when the swivel bracket 122 makes revolution around the first rotation axis X1, the θ coordinate (supplementary angle of altitude) of the accommodating slot 132 of the carrier 130 gets changed, and as shown by FIG. 3, at the time, the carrier 130 moves to a position D2 from the position D1; when the carrier 130 makes rotation around the second rotation axis X2, the Φ coordinate (azimuth) of the accommodating slot 132 gets changed. In other words, every accommodating slot 132 on the circular-arc surface S can be moved to a specific position on the circular-arc surface S for the pick-and-place part 180 to conduct pick-and-place operation by adjusting the θ coordinate and the Φ coordinate.

In following, taking the positioning of the wafer carrier in an evaporation coating process to explain the arc-surface positioning operation method by using the rotary positioning apparatus 100.

Figure 4:
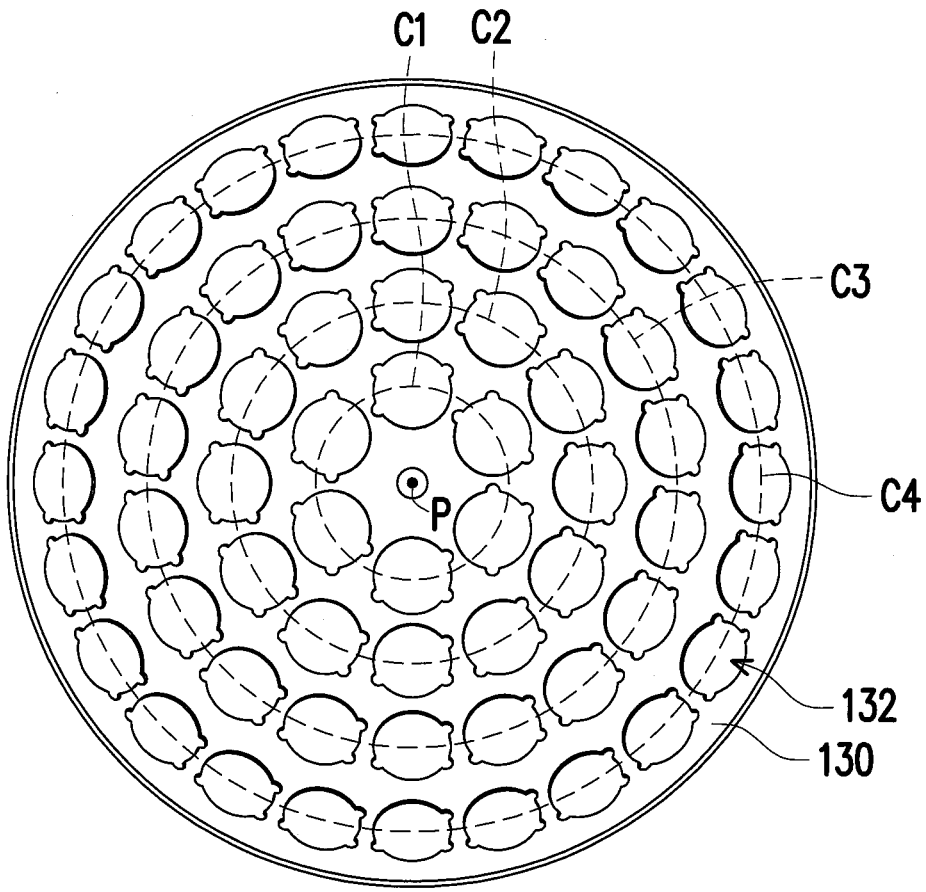
FIG. 4 is a front-view diagram of a wafer carrier according to an embodiment of the disclosure.

FIG. 4 is a front-view diagram of a wafer carrier according to an embodiment of the disclosure, wherein the embodiment takes a carrier 130 with wafer-carrying capacity of 60 pieces as an example and there are 60 accommodating slots 132 for placing wafers. Depending on different pick-and-place ways of wafers, the accommodating slots 132 on the carrier 130 have different designs such as a front-disposing wafer carrier or a back-disposing wafer carrier. The second rotation axis X2 passes through the rotation center P of the carrier 130, and the accommodating slots 132 are arranged along at least one circular locus taking the rotation center P as the circle center thereof. For example, the 60 accommodating slots 132 in the embodiment are arranged along four concentric circle loci C1-C4 taking the rotation center P of the carrier 132 as the circle center thereof, in which, from inner lap to outer lap, the innermost lap (the first lap) allows to place 6 wafers, the second lap is 12 pieces, the third lap is 18 pieces and the fourth lap is 24 pieces.

As shown by FIG. 3, since the distance between any point on the circular-arc surface S of the carrier 130 and the curvature center C is fixed, so that during conveying the wafers, the revolution and the rotation of the carrier 130 around the curvature center C enables any one of the accommodating slots 132 on the carrier 130 keeps a fixed position relationship with the work table surface in a certain duration. In the embodiment, the fixed position relationship is defined as: the plane of any accommodating slot 132 for placing the wafer is parallel to the work table surface H in a certain duration, i.e., the accommodating slot 132 is taking the position available to pick and place component by the pick-and-place part 180. During conveying the wafers, the pick-and-place part 180 is needed to make a vertical or horizontal moving only without making complex three-dimensional motions to achieve picking and placing wafers goal.

No matter a front-disposing wafer carrier design or a back-disposing wafer carrier design, when the carrier 130 gets positioning, the above-mentioned different designs only affect the placing-in direction of the wafers. In other words, regardless which one of the above-mentioned two designs, under the idea of the disclosure, once the plane A of any accommodating slot 132 on the carrier 130 for placing the wafer is parallel to the work table surface H, the placing-in direction of the wafers can be simplified to "placing-in the wafers from the upper or lower position of the carrier 130".

In order to make the plane A of the accommodating slot 132 for placing the wafer parallel to the work table surface H, the carrier 130 needs to make revolution or rotation around the curvature center C. In the embodiment, the connection line between the rotation center P of the carrier 130 and the curvature center C is the second rotation axis X2, while the first rotation axis X1 is perpendicular to the second rotation axis X2 and passes through the curvature center C. In this way, referring to FIG. 3, when the carrier 130 makes revolution around the first rotation axis X1 by an angle (θ, supplementary angle of altitude), the carrier 130 moves to the position D2 from the position D1, and the plane A of an accommodating slot 132 on the carrier 130 for placing the wafer is moved to a position R2 parallel to the work table surface H from the position R1. In addition, in order to make the plane A of every accommodating slot 132 for placing the wafer moved get positioning and parallel to the work table surface H, the carrier 130 needs to make rotation around the second rotation axis X2.

The values of the rotation angles θ can be defined according to the number of laps and the spacing of the circular loci along which the accommodating slots 132 on the carrier 130 are arranged. For example, by making the carrier 130 rotate (revolution) around the first rotation axis X1 by a rotation angle θ corresponding to the spacing between adjacent two circular loci, the accommodating slot 132 on one of the circular loci is moved to the position of the accommodating slot 132 on another one of the circular loci so as to reach the positioning of the coordinate θ (supplementary angle of altitude) through the above-mentioned revolution. On the other hand, the carrier 130 can make rotation around the second rotation axis X2 by an angle Φ, in which the angle Φ ranges from 0° to 360° since the accommodating slots 132 are arranged on the full-circle of the circular locus. The angle Φ is corresponding to the spacing between adjacent two accommodating slots on a same circular locus so that the accommodating slot 132 on the same circular locus is moved to the position of the other accommodating slot 132 so as to reach the positioning of the coordinate Φ (azimuth) through the above-mentioned rotation.

FIGS. 5A-5F are diagrams showing a rotary positioning method according to an embodiment of the disclosure. First referring to FIGS. 5A and 5B, the operation of picking and placing the wafers begins with the accommodating slot (K1-1) which counts the innermost lap of the carrier 130. At the time, the carrier 130 rotates around the first rotation axis X1 by an initial angle α1 and the accommodating slot (K1-1) is moved to get positioning. The plane of the accommodating slot (K1-1) for bearing the wafer at the position is parallel to the work table surface H. Next, the carrier 130 rotates around the second rotation axis X2 by an angle β1 and the accommodating slot (K1-2) is moved to get positioning. In the embodiment, the accommodating slots (K1-1)-(K1-6) counted as the innermost laps are arranged along six equal parts of the full-circle, i.e., arranged in equal spacing, thus angle β1 is 60° in the embodiment, and the rotation angles Φ between the accommodating slots (K1-2) and (K1-3), (K1-3) and (K1-4), (K1-4) and (K1-5) and (K1-5) and (K1-6) are 60° as well. Repeating the above-mentioned steps, the accommodating slots (K1-1)-(K1-6) counted as the innermost laps are sequentially moved to get positioning.

Figure 5A:
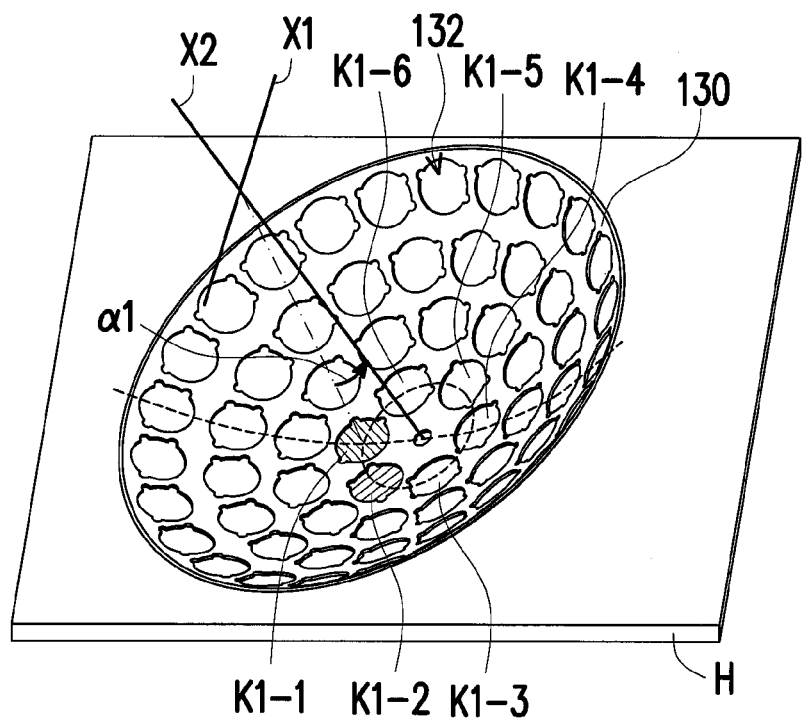
FIGS. 5A-5F are diagrams showing a rotary positioning method according to an embodiment of the disclosure.
Figure 5B:
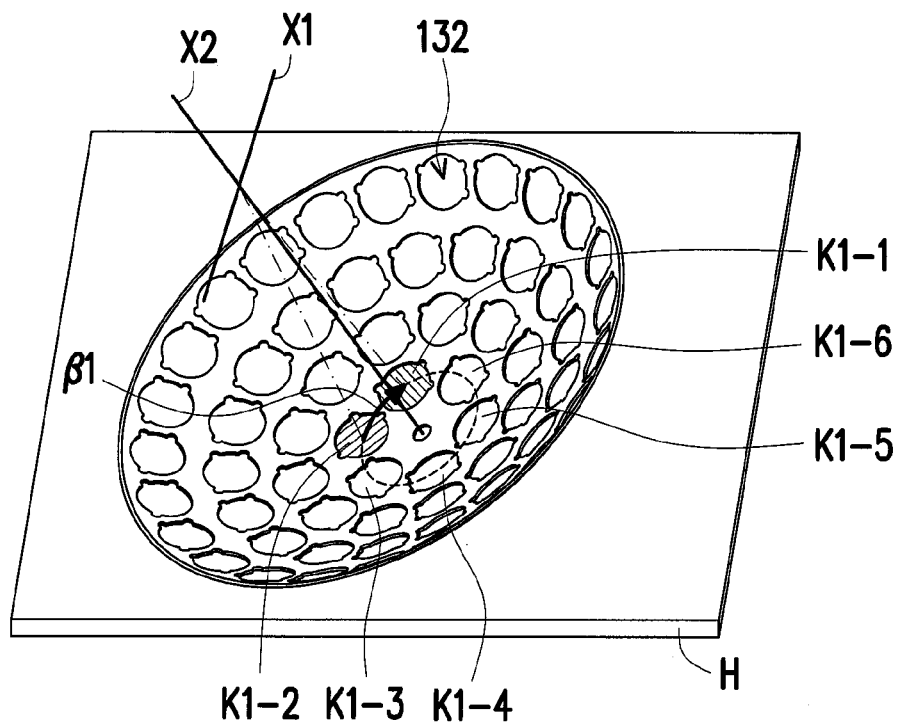
Figure 5C:
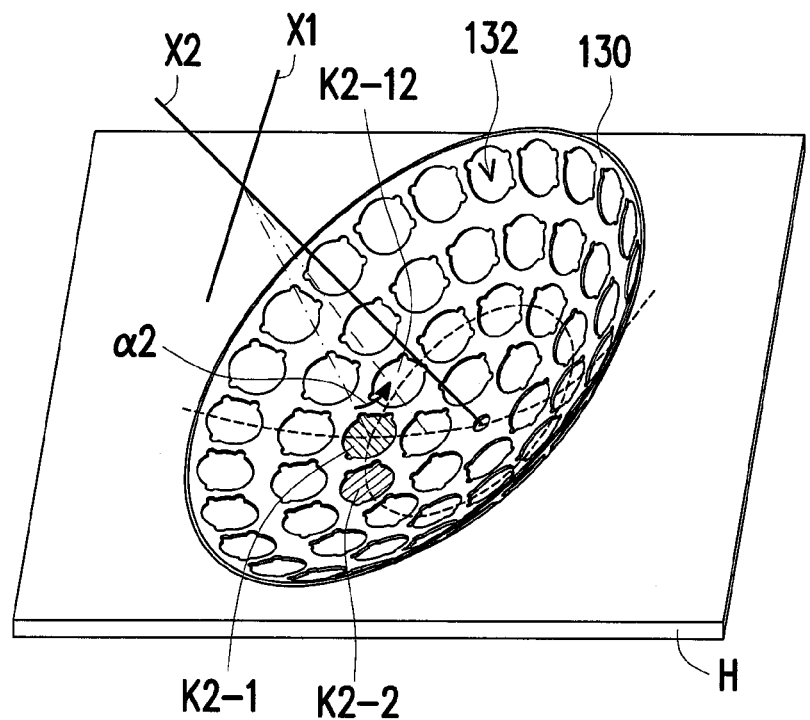
Figure 5D:
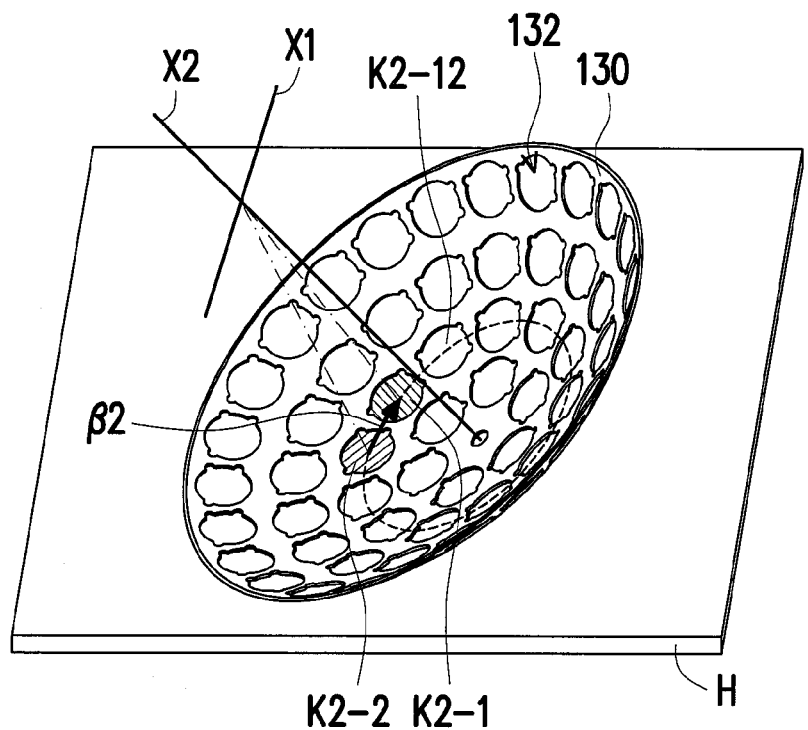

Thereafter referring to FIGS. 5C and 5D, after the operation of picking and placing the wafers at the innermost laps of the carrier 130 is finished, the carrier 130 rotates around the first rotation axis X1 by an angle α2 and the accommodating slot (K2-1) is moved to get positioning. The plane of the accommodating slot (K2-1) for loading the wafer at the position is parallel to the work table surface H. Next, the carrier 130 rotates around the second rotation axis X2 by an angle β2 and the accommodating slot (K2-2) is moved to get positioning, and the analogue for the rest. In the embodiment, the accommodating slots (K2-1)-(K2-12) at the second lap are arranged along duodecimally-divided full-circle, thus angle β2 is 30° in the embodiment, and the rotation angles Φ between rest adjacent accommodating slots (K2-1)-(K2-12) are 30° as well.

Figure 5E:
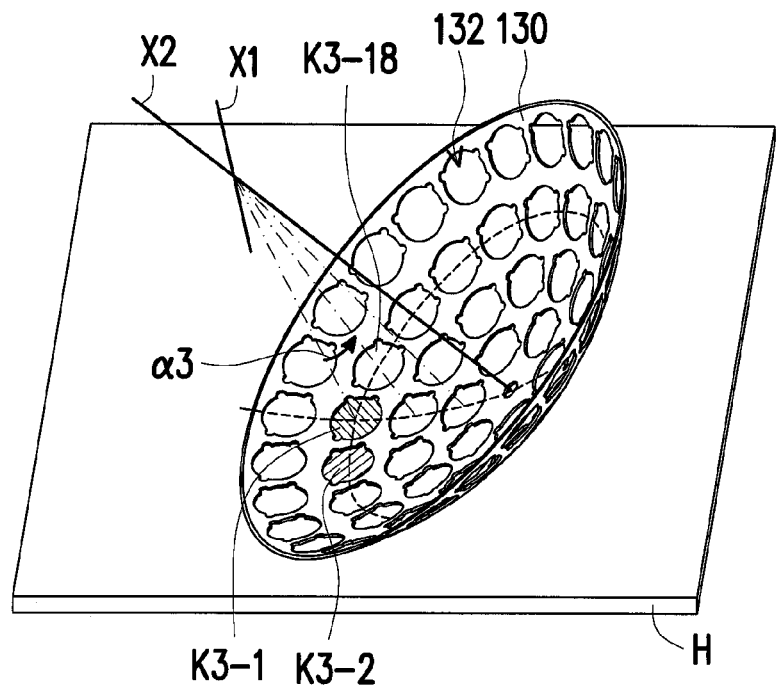
Figure 5F:
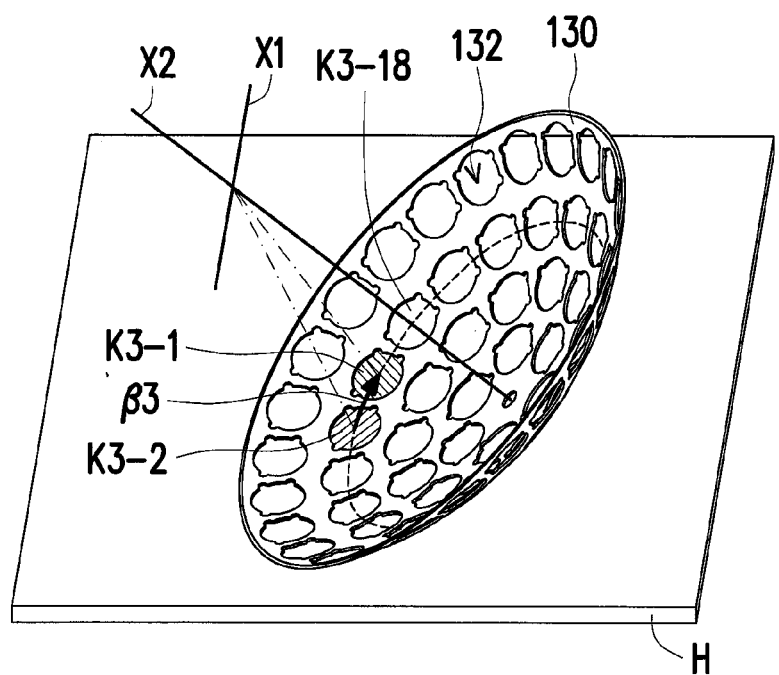

Then referring to FIGS. 5E and 5F, in order to pick and place the wafers on the third lap on the carrier 130, the carrier 130 rotates around the first rotation axis X1 by an angle α3 and the accommodating slot (K3-1) is moved to get positioning. The plane of the accommodating slot (K3-1) for bearing the wafer at the position is parallel to the work table surface H. Next, the carrier 130 rotates around the second rotation axis X2 by an angle β3 and the accommodating slot (K3-2) is moved to get positioning. In the embodiment, the accommodating slots (K3-1)-(K3-18) at the third laps are arranged along eighteen equal parts of the full-circle, thus angle β3 is 20° in the embodiment, and the rotation angles Φ between rest adjacent accommodating slots (K3-1)-(K3-18) are 20° as well. Repeating the above-mentioned steps, the accommodating slots (K1-1)-(K1-6) counted as the innermost laps are sequentially moved to get positioning. The analogue for the rest, the accommodating slot 132 at the outermost lap of the carrier 130 can get positioning through the above-mentioned steps.

The disclosure does not limit the pieces of the accommodating slots 132 on the carrier 130, the number of laps of the circular loci, the spacing of the accommodating slots 132 and the spacing of the circular loci. Although the accommodating slots 132 in the above-mentioned embodiment are arranged in equal spacing, but the spacing between the accommodating slots 132 can be adjusted depending on the real requirement, for example, the spacing between the accommodating slots 132 can be different from each other, wherein the rotation angle Φ corresponding to each spacing needs to be adjusted only to get positioning effect. It is also allowed to make the circular loci arranged in equal spacing or arranged in unequal spacing. When the circular loci are arranged in equal spacing, the above-mentioned values α1, α2 and α3 of the rotation angles θ are equal to each other. Similarly, the spacing between the circular loci can be adjusted depending on the real requirement, and it can achieve positioning effect accordingly by adjusting the rotation angle θ corresponding to each of the spacing only.

By using the rotary positioning apparatus 100 and the operating method thereof provided by the above-mentioned embodiments, the carrier 130 make revolution and rotation around two axes X1 and X2 so that any one of the accommodating slots on the carrier at a specific time-point keeps a fixing position relationship with the work table surface. For example, in order to pick and place wafers from the accommodating slots, the wafers in different accommodating slots will move to the same position parallel to the work table surface to reach the arc-surface positioning effect. As a result, the conveying between the wafers and the carrier 130 does not need multi axial motions and the complex-designed mechanical arm, wherein only need is to use the pick-and-place part 180 as shown by FIG. 1 to grip (or place) wafers from a feeding position (or picking position) through a fixed path (for example, uniaxial or biaxial linear motion).

In the embodiments, swivel bracket 122 is pivoted to the fixing base 110 through the shaft 124, by which the rotation mechanism 120 enables the swivel bracket 122 rotating around the first rotation axis X1 relatively to the fixing base 110. However, the disclosure does not limit the above-mentioned rotation way that the rotation mechanism 120 rotates around the first rotation axis X1 relatively to the fixing base 110.

Figure 6:
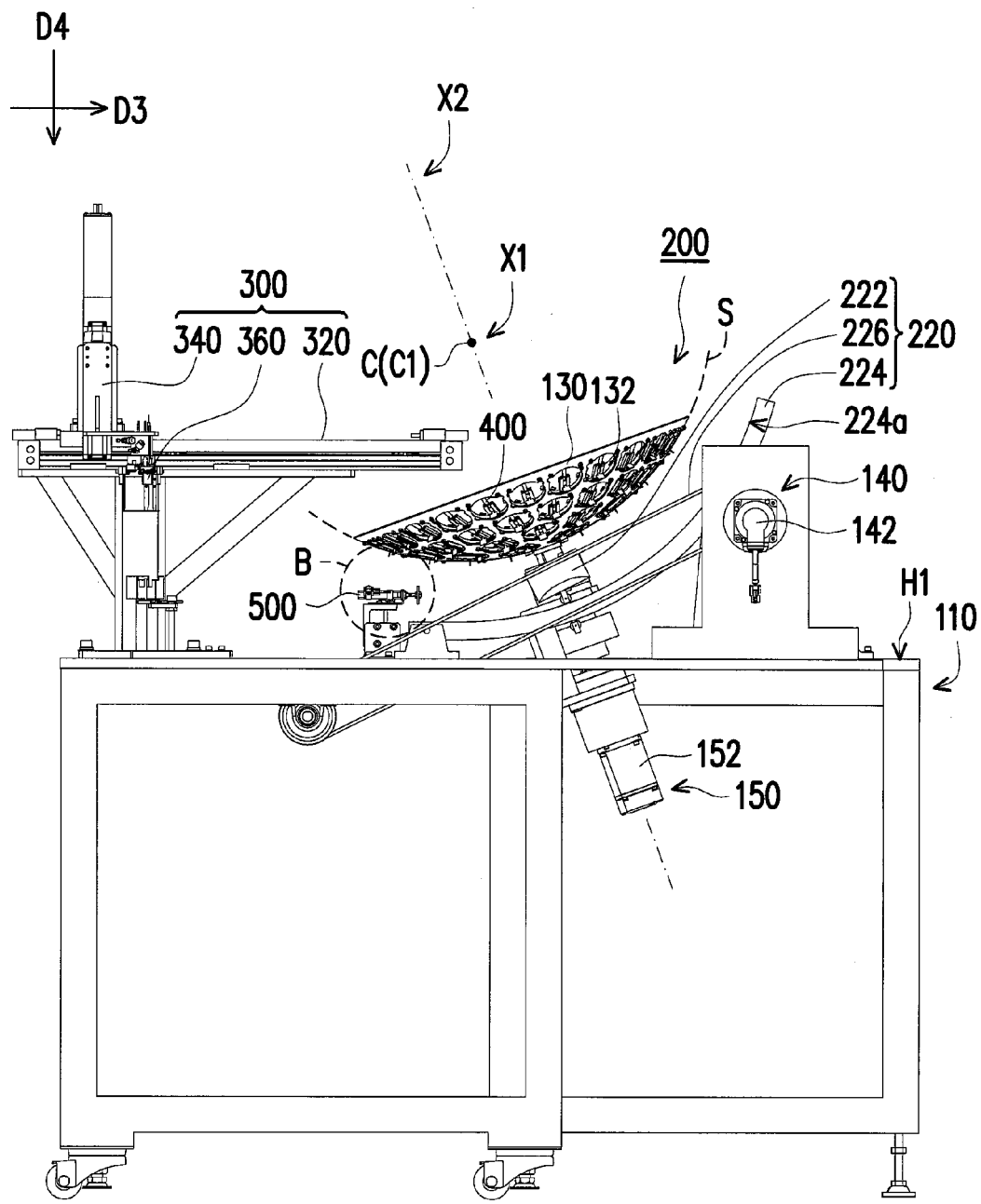
FIG. 6 is a schematic diagram of a rotary positioning apparatus and an automatic pick-and-place system according to an embodiment of the disclosure.

In the following embodiments, the component notations and partial details of the structures can be the same as or similar to the previous embodiment, wherein the same notations represent the same or similar components while the repeated same details are omitted, which can refer to the previous embodiment. FIG. 6 is a schematic diagram of a rotary positioning apparatus and an automatic pick-and-place system according to an embodiment of the disclosure. Referring to FIG. 6, a rotary positioning apparatus 200 includes a fixing base 110, a rotation mechanism 220, a carrier 130, a first driving module 140 and a second driving module 150. The rotation mechanism 220 is disposed on the fixing base 110. The first driving module 140 is disposed on the fixing base 110 and coupled to the rotation mechanism 220 to drive the rotation mechanism 220 rotating around a first rotation axis X1 relatively to the fixing base 110.

The rotary positioning apparatus 200 of the embodiment is similar to the rotary positioning apparatus 100 of FIG. 1 except the difference of the parts of the rotation mechanism and the action mechanism. The rotation mechanism 220 of the embodiment includes a swivel bracket 222 and an arc-shaped guide track 224, in which the arc-shaped guide track 224 is disposed on the fixing base 110 and the swivel bracket 222 is disposed in sliding way at the arc-shaped guide track 224 to rotate around the first rotation axis X1 relatively to the fixing base 110. In more details, the arc-shaped guide track 224 has a guiding circular-arc surface 224a, the curvature center C1 of the guiding circular-arc surface 224a is on the first rotation axis X1 and the swivel bracket 222 is disposed on the guiding circular-arc surface 224a. So, when the swivel bracket 222 is disposed in sliding way on the guiding circular-arc surface 224a, the swivel bracket 222 rotates around the curvature center C1 and meanwhile rotates around the first rotation axis X1 relatively to the fixing base 110.

The first driving module 140, as shown by FIG. 6, is disposed at the fixing base 110 and pivoted to the rotation mechanism 220 to drive the rotation mechanism 220 rotating around the first rotation axis X relatively to the fixing base 110. In more details, the first driving module 140 of the embodiment includes a servo motor 142 and the rotation mechanism 220 includes a transmission part 226, such as a belt, a rack, a sprocket or a rope. The transmission part 226 is disposed between the swivel bracket 222 and the first driving module 140, and the servo motor 142 is coupled to the transmission part 226 to drive the transmission part 226, so that the swivel bracket 222 is driven to rotate around the first rotation axis X1 relatively to the fixing base 110.

In addition, the carrier 130 of the embodiment is pivoted to the swivel bracket 222 through the second rotation axis X2 and the virtual pivoting point is located above the swivel bracket 222, while the second driving module 150 is disposed below the swivel bracket 222 and coupled to the carrier 130. The second driving module 150 can include a servo motor 152, by which the carrier 130 is driven to rotate around the second rotation axis X2 relatively to the swivel bracket 222. The carrier 130 of the embodiment is similar to the embodiment of FIG. 3 and has a plurality of accommodating slots 132 and the carrier 130 has, for example, circular-arc shape to make the accommodating slots 132 located on a circular-arc surface S. In the embodiment, the curvature center C of the circular-arc surface S coincides with the curvature center C1 of the guiding circular-arc surface 224a. The second rotation axis X2 passes through the curvature center C of the circular-arc surface S and is perpendicular to the first rotation axis X1 (i.e., perpendicular to the page).

Under the above-mentioned layout, the rotary positioning apparatus 200 in the embodiment uses the first driving module 140 to drive the swivel bracket 222 to make revolution around the first rotation axis X1 and uses the second driving module 150 to drive the carrier 130 to make rotation around the second rotation axis X2 so as to establish a rotary positioning mode under a spherical coordinate system, and thus, every of accommodating slots 132 on the carrier 130 can sequentially move to get positioning. Specifically, referring to FIG. 3, the carrier 130 of the embodiment is similar to the embodiment of FIG. 3 and adopts the rotary positioning mode under a spherical coordinate system, wherein the curvature center C (i.e., C1 in FIG. 6) serves as the origin of the spherical coordinate system (r, θ, Φ). When the swivel bracket 122 makes revolution around the first rotation axis X1, the θ coordinate of the accommodating slot 132 of the carrier 130 gets changed; when the carrier 130 makes rotation around the second rotation axis X2, the Φ coordinate of the accommodating slot 132 gets changed. Therefore, the rotary positioning apparatus 200 of the embodiment, as shown by FIGS. 5A-5F, enables every plane to place component on the carrier 130 moving to get positioning and achieve the arc-surface positioning effect. In the embodiment, when the plane to place component on the carrier 130 moves to get positioning, the plane to place component is parallel to the work table surface H of the fixing base 110.

Referring to FIG. 6, FIG. 6 is a schematic diagram of an automatic pick-and-place system 50 using the rotary positioning apparatus 200. The automatic pick-and-place system 50 in the embodiment can achieve the arc-surface positioning effect by using the rotary positioning apparatus 200, which in association with other devices can fix or pick and place the component on the carrier 130. It should be noted that in the embodiment the automatic pick-and-place system 50 plus the rotary positioning apparatus 200 is an example only. In fact, the automatic pick-and-place system 50 can use the above-mentioned to achieve the arc-surface positioning effect as well.

The automatic pick-and-place system 50 includes the rotary positioning apparatus 200, a pick-and-place apparatus 300, a plurality of positioning assemblies 400 and an actuating element 500. In the embodiment, the carrier 130 is, for example, a wafer carrier. The pick-and-place apparatus 300 of the automatic pick-and-place system 50 is disposed at the fixing base 110 and located at a side of the carrier 130. When each of the accommodating slots 132 sequentially moves to get positioning, the pick-and-place apparatus 300 grippes a wafer from or places a wafer to the accommodating slot 132. In more details, the pick-and-place apparatus 300 includes a first transmission mechanism 320, a second transmission mechanism 340 and a gripper jaw 360. In the embodiment, the gripper jaw 360 can be a flexible gripper jaw, and the gripper jaw 360 is connected to the first transmission mechanism 320 and the second transmission mechanism 340. The first transmission mechanism 320 is configured to drive the gripper jaw 360 moving in a first direction D3, and the second transmission mechanism 340 is configured to drive the gripper jaw 360 moving in a second direction D4.

In the embodiment, the first direction D3 is perpendicular to the normal direction of the work table surface H1 of the fixing base 110, while the second direction D4 is parallel to the normal direction of the work table surface H1 of the fixing base 110. When the first transmission mechanism 320 drives the gripper jaw 360 moving in the first direction D3, the gripper jaw 360 moves forth and back relatively to the carrier 130; when the second transmission mechanism 340 drives the gripper jaw 360 moving in the second direction D4, the gripper jaw 360 moves up and down relatively to the carrier 130. By means of the first transmission mechanism 320 and the second transmission mechanism 340, the gripper jaw 360 can approach or depart from the carrier 130.

In addition, in the embodiment, the automatic pick-and-place system 50 further includes a plurality of positioning assemblies 400 and an actuating element 500. Each of the positioning assemblies 400 is disposed beside the corresponding accommodating slot 132 for gripping the wafer in the accommodating slot 132, so that the wafer in each of the accommodating slots 132 can be fixed by the corresponding positioning assembly 400 to avoid the wafers in the accommodating slots 132 from falling down from the accommodating slots 132 or deflecting during the rotation of the carrier 130. The actuating element 500 is disposed on the fixing base 110 for releasing the gripping on the wafers by the positioning assemblies 400 when each of the accommodating slots 132 moves to get positioning.

Figure 7:
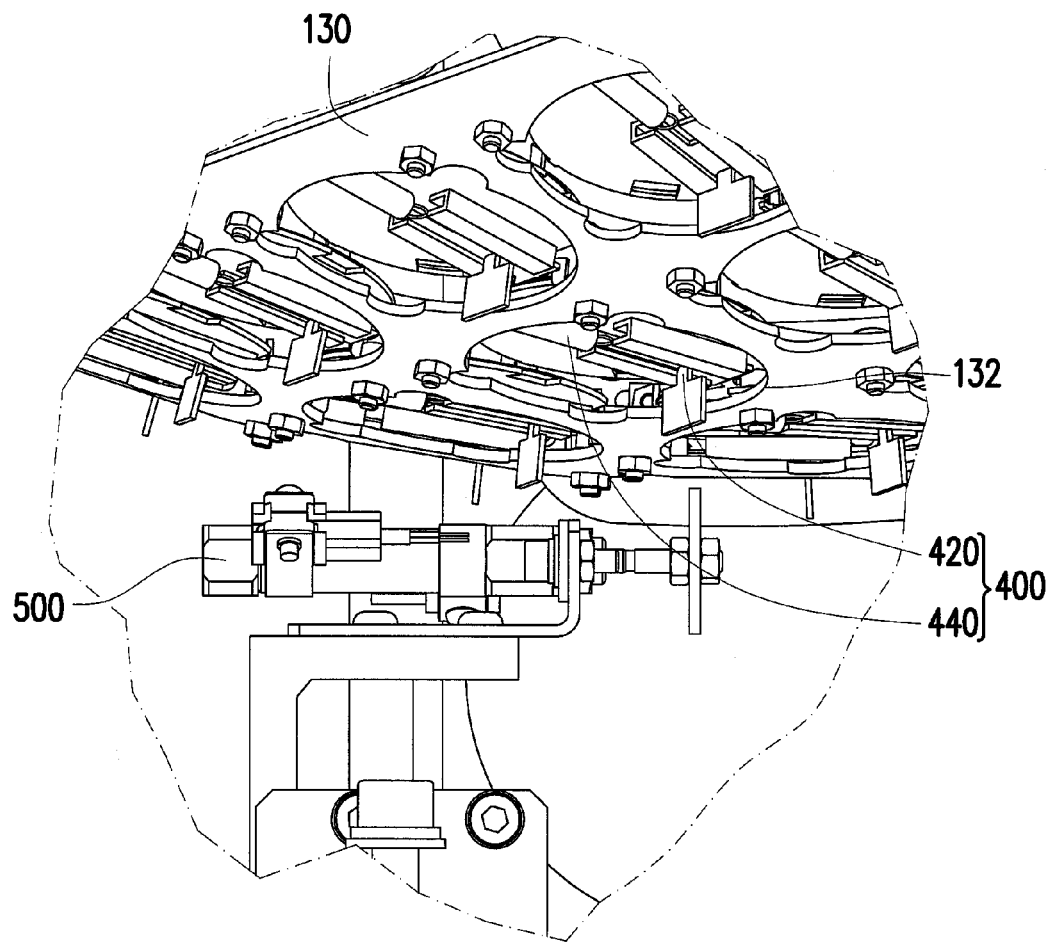
FIG. 7 is an enlargement diagram of the portion B in FIG. 6.

FIG. 7 is an enlargement diagram of the portion B in FIG. 6. Referring to FIG. 7, each of the positioning assemblies 400 includes a hook 420 and an elastic member 440 such as a spring. Each of the positioning assemblies 400 is connected between each hook 420 and the corresponding accommodating slot 132. In the embodiment, the actuating element 500 is disposed nearby the positioning assembly 400. When the accommodating slot 132 moves to get positioning, the actuating element 500 pushes the hook 420 to release the gripping on the wafers by the positioning assemblies 400, and after the releasing by the positioning assembly 400, the elastic member 440 resumes the hook 420.

Figure 8:
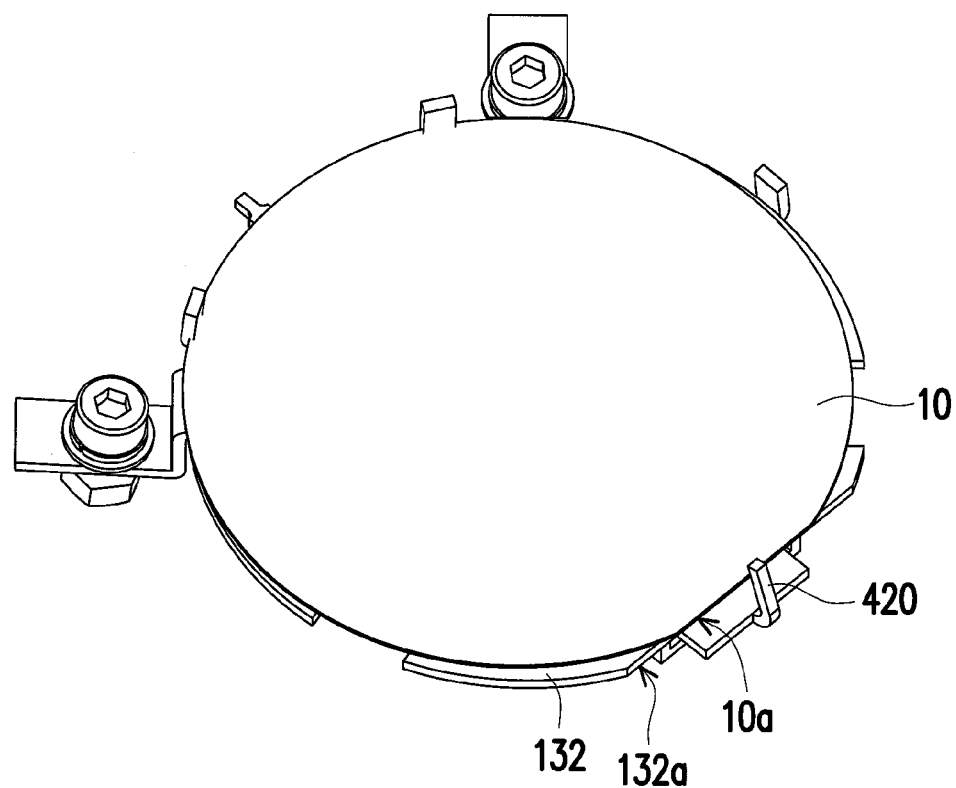
FIG. 8 is a diagram illustrating the accommodating slots of the carrier in FIG. 6 bear wafers.
Figure 9:
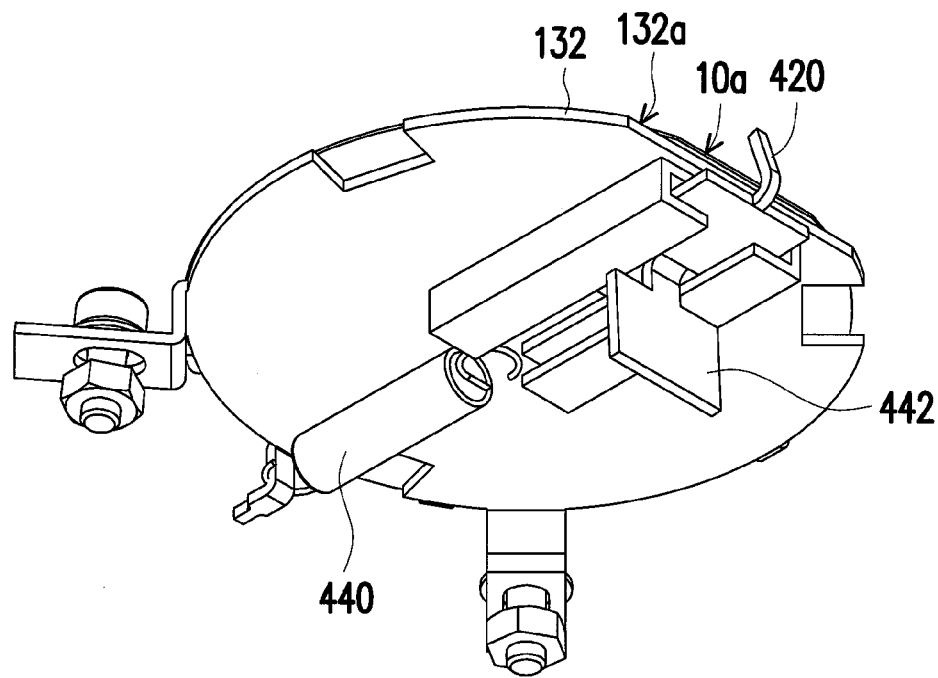
FIG. 9 is the diagram of the accommodating slots of FIG. 8 in another angle of viewing.

FIG. 8 is a diagram illustrating the accommodating slots of the carrier in FIG. 6 loading wafers and FIG. 9 is the diagram of the accommodating slots of FIG. 8 in another angle of viewing. Referring to FIGS. 8 and 9, the hook 420 extends from the back of the carrier 130 to the front of the carrier 130 for gripping a wafer 10 in the accommodating slot 132. The accommodating slot 132 has a side 132a and the wafer 10 has a side 10a. When the wafer 10 is placed in the accommodating slot 132, the side 10a is flash with the side 132a and at the time the hook 420 gets hooking at the side 10a and the side 132a. In addition as shown by FIG. 9, the hook 420 has an extending portion 422, when the accommodating slot 132 moves to get positioning, the extending portion 422 is located beside the actuating element 500 (not shown in figure), so that the actuating element 500 can push the extending portion 422 to make the hook 420 departing from the accommodating slot 132 to release the holding between the hook 420 and the wafer 10.

The parts and the functions thereof of the automatic pick-and-place system 50 are depicted above. In following, the operating method of the automatic pick-and-place system 50 is explained through examples. For example, in beginning, the gripper jaw 360 of the pick-and-place apparatus 300 in the automatic pick-and-place system 50 of the embodiment grips a wafer from an initial position, and the first transmission mechanism 320 drives the gripper jaw 360 to move in the first direction D3 to approach the carrier 130. Next, the carrier 130 of the rotary positioning apparatus 200 makes revolution and rotation respectively around the two axes X1 and X2 so that each of the accommodating slots 132 of the carrier 130 sequentially moves to get positioning, which can refer to FIGS. 5A-5F to get understanding.

Referring to FIGS. 5A and 6-9, when the carrier 130 rotates, as shown by FIG. 5A, to make the accommodating slot (K1-1) move to get positioning, the actuating element 500 pushes the extending portion 422 of the hook 420 disposed at the accommodating slot (K1-1) so as to make the hook 420 depart from the accommodating slot (K1-1). During the actuating element 500 is pushing the hook 420, the hook 420 drives the elastic member 440 getting deformed, and during the deformation of the elastic member 440 an elastic potential energy is stored. Then, the second transmission mechanism 340 of the pick-and-place apparatus 300 drives the gripper jaw 360 to move in the second direction D4 to move the gripper jaw 360 to the above-mentioned positioning position. At the time, the gripper jaw 360 releases the gripped wafer to place the wafer in the accommodating slot (K1-1). Further, the actuating element 500 releases the extending portion 422 of the hook 420 and the stored elastic potential energy during pulling the elastic member 440 so as to drive the hook 420 getting resumed, which further grips the wafer placed on the accommodating slot (K1-1). Thereafter, the first transmission mechanism 320 and the second transmission mechanism 340 of the pick-and-place apparatus 300 drive the gripper jaw 360 to go back to the initial position so as to grip another wafer.

Moreover, the first transmission mechanism 320 drives the gripper jaw 360 to move in the first direction D3 to approach the carrier 130. The carrier 130 continuously rotates, as shown by FIG. 5B, to make the next accommodating slot (K1-2) moves to the above-mentioned position, followed by pushing the hook 420 disposed at the accommodating slot (K1-2) by the actuating element 500 to repeat the above-mentioned steps to grip the wafer placed on the accommodating slot (K1-2). By repeating the above-mentioned steps, the wafer can be placed in each of the accommodating slots 132 and fixed.

It should be noted that, in the above-mentioned example, the gripper jaw 360 is used to place the wafer in the accommodating slots 132, but the gripper jaw 360 can be also used to grip the wafer originally placed in the accommodating slots 132, in which the steps are similar to the above-mentioned steps except the difference that when the gripper jaw 360 is used to grip the wafer originally placed in the accommodating slots 132, the gripper jaw 360 at the initial position does not grip the wafer. After the first transmission mechanism 320 and the second transmission mechanism 340 drive the gripper jaw 360 to move to get positioning, the actuating element 500 would push the extending portion 422 to release the gripping on the wafers in the accommodating slots 132 by the positioning assemblies 400. At the time, the gripper jaw 360 can grip the wafers located in the accommodating slots 132 from the accommodating slots 132. Then, the actuating element 500 departs from the accommodating slots 132, while the elastic member 440 returns the hook 420 to its original position.

By using the rotary positioning apparatus 200, the automatic pick-and-place system 50 of the embodiment enables every plane on the carrier 130 for placing the wafer moving to get positioning and is parallel to the work table surface H. Thus, the pick-and-place apparatus 300 only needs to make translations in the first direction D3 and the second direction D4 without complex motions to be able to grip a wafer from the accommodating slots 132 or place a wafer to the accommodating slots 132. In addition, the corresponding positioning assembly 400 is disposed beside each of the accommodating slots 132, which can fix the components placed in the accommodating slots 132 during the rotation of the carrier. The positioning assemblies 400 in association with the actuating element 500 can release the gripping on the components by the positioning assemblies 400.

It will be apparent to those skilled in the art that the descriptions above are several preferred embodiments of the disclosure only, which does not limit the implementing range of the disclosure. Various modifications and variations can be made to the structure of the disclosure without departing from the scope or spirit of the disclosure. The claim scope of the disclosure is defined by the claims hereinafter.

What is claimed is:

1. A rotary positioning apparatus, comprising:
   a fixing base;
   a rotation mechanism, disposed on the fixing base;
   a first driving module, disposed on the fixing base and coupled to the rotation mechanism to drive the rotation mechanism rotating around a first rotation axis relatively to the fixing base;
   a carrier, having a plurality of accommodating slots, wherein the accommodating slots are located on one of circular-arc surfaces of the carrier, the carrier is pivoted to the rotation mechanism through a second rotation axis, the second rotation axis passes through the curvature center of the circular-arc surface and perpendicular to the first rotation axis, and the curvature center is located on the first rotation axis; and
   a second driving module, disposed on the rotation mechanism and coupled to the carrier to drive the carrier rotating around the second rotation axis relatively to the rotation mechanism.

2. The rotary positioning apparatus as claimed in claim 1, wherein the rotation mechanism comprises:
   a swivel bracket; and
   an arc-shaped guide track, disposed on the fixing base, wherein the swivel bracket is disposed in sliding way at the arc-shaped guide track so as to rotate around the first rotation axis relatively to the fixing base.

3. The rotary positioning apparatus as claimed in claim 1, wherein the second rotation axis passes through a rotation center of the carrier and the accommodating slots are arranged along at least one of circular loci taking the rotation center as the circle center thereof.

4. The rotary positioning apparatus as claimed in claim 3, wherein the accommodating slots are arranged along a plurality of concentric circle loci.

5. An operating method of a rotary positioning apparatus, comprising:
   providing the rotary positioning apparatus as claimed in claim 1;
   driving the rotation mechanism to rotate around the first rotation axis relatively to the fixing base by using the first driving module;
   driving the carrier to rotate around the second rotation axis relatively to the rotation mechanism by using the second driving module,
   so that the accommodating slots on the carrier sequentially move to the same position.

6. The operating method of a rotary positioning apparatus as claimed in claim 5, wherein the rotation mechanism comprises a swivel bracket and an arc-shaped guide track, the arc-shaped guide track is disposed on the fixing base and the swivel bracket is disposed in sliding way at the arc-shaped guide track so as to rotate around the first rotation axis relatively to the fixing base.

7. The operating method of a rotary positioning apparatus as claimed in claim 5, further comprising:
   gripping or placing a component from the accommodating slot on the same position by using a pick-and-place apparatus.

8. The operating method of a rotary positioning apparatus as claimed in claim 7, wherein the pick-and-place apparatus comprises a first transmission mechanism, a second transmission mechanism and a gripper jaw, the gripper jaw is connected to the first transmission mechanism and the second transmission mechanism, wherein the first transmission mechanism is configured to drive the gripper jaw moving in a first direction and the second transmission mechanism is configured to drive the gripper jaw moving in a second direction.

9. The operating method of a rotary positioning apparatus as claimed in claim 5, further comprising:
   gripping or placing a component on each of the accommodating slots by using a positioning assembly.

10. The operating method of a rotary positioning apparatus as claimed in claim 9, wherein the positioning assembly comprises a hook and an elastic member, the elastic member is connected between the hook and the accommodating slot, and the step of gripping or placing the component from the accommodating slot on the same position comprises:
    pushing the hook far away from the accommodating slot and the elastic member stores an elastic potential energy;
    gripping or placing the component from the accommodating slot on the same position by using the pick-and-place apparatus; and
    releasing the elastic potential energy stored in the elastic member to drive the hook for resuming.

11. The operating method of a rotary positioning apparatus as claimed in claim 5, wherein the second rotation axis passes through a rotation center of the carrier and the accommodating slots are arranged along at least one of circular loci taking the rotation center as the circle center thereof, and the step of driving the carrier to rotate around the second rotation axis relatively to the rotation mechanism by using the second driving module comprises: making the carrier rotate by an angle corresponding to a first rotation angle between two accommodating slots on a same circular locus.

12. The operating method of a rotary positioning apparatus as claimed in claim 11, wherein the accommodating slots are arranged along a plurality of concentric circle loci, and the step of driving the swivel bracket to rotate around the first rotation axis relatively to the fixing base by using the first driving module comprises: making the carrier rotate by a second rotation angle corresponding to the angular spacing between adjacent two circular loci.

13. An operating method of a rotary positioning apparatus, comprising:
   the accommodating slots are arranged along a plurality of concentric circle loci taking the rotation center as the circle center thereof,
   (1) providing the rotary positioning apparatus as claimed in claim 1;
   (2) driving the carrier to rotate around the second rotation axis relatively to the rotation mechanism by using the second driving module by a first rotation angle corresponding to the angular spacing between two accommodating slots on a same circular locus;
   (3) repeating step (2) to make all the accommodating slots on the carrier sequentially move to the same position;
   (4) driving the rotation mechanism to rotate around the first rotation axis relatively to the fixing base by using the first driving module by a second rotation angle, wherein the second rotation angle is corresponding to the angular spacing between two circular loci so that one of the accommodating slots on another circular locus moves to the same position; and
   (5) repeating steps (2)-(3).

14. The operating method of a rotary positioning apparatus as claimed in claim 13, wherein the rotation mechanism comprises a swivel bracket and an arc-shaped guide track, the arc-shaped guide track is disposed on the fixing base and the swivel bracket is disposed in sliding way at the arc-shaped guide track so as to rotate around the first rotation axis relatively to the fixing base.

15. The operating method of a rotary positioning apparatus as claimed in claim 13, further comprising:
   gripping or placing a component from the accommodating slot on the same position by using a pick-and-place apparatus.

16. The operating method of a rotary positioning apparatus as claimed in claim 15, wherein the pick-and-place apparatus comprises a first transmission mechanism, a second transmission mechanism and a gripper jaw, the gripper jaw is connected to the first transmission mechanism and the second transmission mechanism, wherein the first transmission mechanism is configured to drive the gripper jaw moving in a first direction and the second transmission mechanism is configured to drive the gripper jaw moving in a second direction.

17. The operating method of a rotary positioning apparatus as claimed in claim 13, further comprising:
   gripping or placing a component on each of the accommodating slots by using a positioning assembly.

18. The operating method of a rotary positioning apparatus as claimed in claim 17, wherein the positioning assembly comprises a hook and an elastic member, the elastic member is connected between the hook and the accommodating slot, and the step of gripping or placing the component from the accommodating slot on the same position comprises:
   pushing the hook far away from the accommodating slot and the elastic member stores an elastic potential energy;
   gripping or placing the component from the accommodating slot on the same position by using the pick-and-place apparatus; and
   releasing the elastic potential energy stored in the elastic member to drive the hook for resuming.

19. The operating method of a rotary positioning apparatus as claimed in claim 13, further comprising: prior to step (2), driving the swivel bracket to rotate around the first rotation axis relatively to the fixing base by using the first driving module by an initial rotation angle so as to make one of the accommodating slots on the circular locus in step (2) move to the same position.

20. An automatic pick-and-place system, configured to pick and place a component; the automatic pick-and-place system comprising:
   a rotary positioning apparatus, comprising:
      a fixing base;
      a rotation mechanism, disposed on the fixing base;
      a first driving module, disposed on the fixing base and coupled to the rotation mechanism to drive the rotation mechanism rotating around a first rotation axis relatively to the fixing base;
      a carrier, having a plurality of accommodating slots, wherein the accommodating slots are located on one of circular-arc surfaces of the carrier, the carrier is pivoted to the rotation mechanism through a second rotation axis, the second rotation axis passes through the curvature center of the circular-arc surface and perpendicular to the first rotation axis, and the curvature center is located on the first rotation axis; and
      a second driving module, disposed on the rotation mechanism and coupled to the carrier to drive the carrier rotating around the second rotation axis relatively to the rotation mechanism, wherein when the rotation mechanism rotates around the first rotation axis relatively to the fixing base and the carrier rotates around the second rotation axis relatively to the rotation mechanism, each of the accommodating slots sequentially moves to a same position;
   a pick-and-place apparatus, wherein when each of the accommodating slots sequentially moves to a same position, the pick-and-place apparatus grips or places the components; and
   a plurality of positioning assemblies, disposed beside the corresponding accommodating slot for gripping the component in the accommodating slot; and
   an actuating element, disposed on the fixing base for releasing the gripping of the positioning assembly on the component when each of the accommodating slots moves to the same position.

21. The automatic pick-and-place system as claimed in claim 20, wherein the rotation mechanism comprises:
   a swivel bracket; and
   an arc-shaped guide track, disposed on the fixing base, wherein the swivel bracket is disposed in sliding way at the arc-shaped guide track so as to rotate around the first rotation axis relatively to the fixing base.

22. The automatic pick-and-place system as claimed in claim 20, wherein the pick-and-place apparatus comprises:
   a first transmission mechanism;
   a second transmission mechanism; and
   a gripper jaw, connected to the first transmission mechanism and the second transmission mechanism, wherein the first transmission mechanism is configured to drive the gripper jaw moving in a first direction and the second transmission mechanism is configured to drive the gripper jaw moving in a second direction.

23. The automatic pick-and-place system as claimed in claim 20, wherein each of the positioning assemblies comprises:
- a hook, for gripping the component in the accommodating slot; and
- an elastic member, connected between the hook and the accommodating slot to resume the hook.

24. The automatic pick-and-place system as claimed in claim 20, wherein the second rotation axis passes through a rotation center of the carrier and the accommodating slots are arranged along at least one of circular loci taking the rotation center as the circle center thereof.

25. The automatic pick-and-place system as claimed in claim 24, wherein the accommodating slots are arranged along a plurality of concentric circle loci.

26. The automatic pick-and-place system as claimed in claim 20, wherein the operating method comprises:
- driving the rotation mechanism to rotate around the first rotation axis relatively to the fixing base by using the first driving module;
- driving the carrier to rotate around the second rotation axis relatively to the rotation mechanism by using the second driving module so that the accommodating slots on the carrier sequentially move to the same position;
- gripping or placing the component from the accommodating slot on the same position by using the pick-and-place apparatus; and
- gripping or placing the component on the accommodating slot by using the positioning assembly.

* * * * *